(12) United States Patent
Fuhrmann et al.

(10) Patent No.: US 12,507,487 B2
(45) Date of Patent: Dec. 23, 2025

(54) MULTI-JUNCTION SOLAR CELL

(71) Applicant: AZUR SPACE SOLAR POWER GMBH, Heilbronn (DE)

(72) Inventors: Daniel Fuhrmann, Heilbronn (DE); Gregor Keller, Heilbronn (DE); Rosalinda Van Leest, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 286 days.

(21) Appl. No.: 17/009,071

(22) Filed: Sep. 1, 2020

(65) Prior Publication Data

US 2020/0395495 A1    Dec. 17, 2020

Related U.S. Application Data

(63) Continuation of application No. PCT/EP2019/000057, filed on Feb. 26, 2019.

(30) Foreign Application Priority Data

Mar. 1, 2018   (DE) ............... 10 2018 001 592.1

(51) Int. Cl.
*H10F 10/142*   (2025.01)
*H10F 77/124*   (2025.01)
*H10F 77/14*    (2025.01)

(52) U.S. Cl.
CPC ....... *H10F 10/142* (2025.01); *H10F 77/1248* (2025.01); *H10F 77/146* (2025.01)

(58) Field of Classification Search
CPC .......... H01L 31/0687; H01L 31/03046; H01L 31/035236; Y02E 10/544
See application file for complete search history.

(56) References Cited

U.S. PATENT DOCUMENTS

| | | | |
|---|---|---|---|
| 4,688,068 A | * | 8/1987 | Chaffin .............. H01L 31/0687 136/249 |
| 6,150,603 A | | 11/2000 | Karam et al. |
| 6,255,580 B1 | | 7/2001 | Karam et al. |
| 9,530,911 B2 | | 12/2016 | King et al. |
| 10,439,091 B2 | | 10/2019 | King et al. |

(Continued)

FOREIGN PATENT DOCUMENTS

| | | |
|---|---|---|
| EP | 1 047 136 A2 | 10/2000 |
| EP | 2 779 253 A1 | 9/2014 |

(Continued)

OTHER PUBLICATIONS

Guter et al., "Development of Upright Metamorphic 4J Space Solar Cells," Presentation, Space Power Workshop, Manhattan Beach, CA, pp. 1-30 (2017).

(Continued)

*Primary Examiner* — Angelo Trivisonno
(74) *Attorney, Agent, or Firm* — Muncy, Geissler, Olds & Lowe, P.C.

(57) ABSTRACT

A stacked multi-junction solar cell comprising a stack composed of a bottom subcell, at least one middle subcell, and a top subcell, wherein each subcell has an emitter and a base at least the top subcell is made of a III-V semiconductor material or includes a III-V semiconductor material, and the emitter of the top subcell includes a superlattice.

15 Claims, 1 Drawing Sheet

(56) References Cited

U.S. PATENT DOCUMENTS

| | | | |
|---|---|---|---|
| 2009/0188554 A1* | 7/2009 | Aiken | H01L 31/022433 |
| | | | 136/256 |
| 2012/0240987 A1 | 9/2012 | King et al. | |
| 2013/0263923 A1 | 10/2013 | Jones-Albertus et al. | |
| 2014/0261611 A1* | 9/2014 | King | H01L 31/035209 |
| | | | 136/244 |

FOREIGN PATENT DOCUMENTS

| | | |
|---|---|---|
| RU | 2539102 C1 | 1/2015 |
| RU | 2539109 C1 | 1/2015 |

OTHER PUBLICATIONS

Cornfeld et al., "Evolution of a 2.05 eV AlGaInP Top Sub-cell for 5 and 6J-IMM Applications," $38^{th}$ IEEE Photovoltaic Specialists Conference (PSVC), pp. 1-4 (2012).

* cited by examiner

MULTI-JUNCTION SOLAR CELL

This nonprovisional application is a continuation of International Application No. PCT/EP2019/000057, which was filed on Feb. 26, 2019, and which claims priority to German Patent Application No. 10 2018 001 592.1, which was filed in Germany on Mar. 1, 2018, and which are both herein incorporated by reference.

BACKGROUND OF THE INVENTION

Field of the Invention

The present invention relates to a multi-junction solar cell.

Description of the Background Art

In order to better utilize the solar spectrum, multi-junction solar cells generally comprise three or more subcells with different band gaps that are matched to one another, wherein the top subcell has the largest band gap and the bottom subcell has the smallest band gap, and the top subcell is located on the sun-facing side of the multi-junction solar cell.

Such multi-junction solar cells are known, for example from the paper "Development of Upright Metamorphic 4J Space Solar Cells," by W. Guter et al., Space Power Workshop 2017, Manhattan Beach, CA.

In lattice-matched multi-junction solar cells on a germanium substrate, the top subcell of a multi-junction solar cell, hereinafter also referred to as the upper cell, is often made of InGaP with a band spacing of approximately 1.88 eV.

The InGaP upper cell exhibits an open circuit terminal voltage $V_{oc}$ of approximately 1.4 V. To increase the efficiency of multi-junction solar cells, both metamorphic and lattice-matched concepts with more than 3 subcells are being pursued.

The upper cell is made of InAlGaP in this case, wherein the addition of Al causes the band spacing to widen and the open circuit terminal voltage of the upper cell to increase to values greater than 1.4 V.

The InAlGaP upper cell does indeed have a higher band gap and a higher open circuit terminal voltage $V_{oc}$ in comparison with the Al-free InGaP upper cell, but the InAlGaP upper cell has a sheet resistance that is approximately five times as high as that of the InGaP upper cell.

The higher sheet resistance of the InAlGaP upper cell results in higher series resistive losses in the multi-junction solar cell, in particular at higher currents. In order to keep the losses low at higher currents, in particular for concentrator applications, which is to say CPV applications, the spacing between the metal fingers on the top surface of the InAlGaP upper cell must be reduced as compared with the InGaP upper cell. However, this results in greater shadowing, reducing the efficiency of the solar cell as a whole.

In an application for CPV, therefore, adequate transverse conductivity is especially important for high efficiency.

It is known from "Evolution of a 2.05 eV AlGaInP Top Sub-Cell for 5 and 6J-IMM Applications," Arthur B. Cornfeld et al., 38th IEEE Photovoltaic Specialists Conference (PVSC), 2012, to design an upper cell as a heterojunction cell with an InGaP emitter and an InAlGaP base. However, in this design a substantial voltage loss of approximately 160 mV nevertheless occurs as compared with an exclusively InAlGaP cell.

Multi-junction cells are known from U.S. Pat. No. 4,688,068 A1, from EP 2 779 253 A1, and from US 2012/240 987 A1, wherein an MQW structure is formed between the emitter and base in the subcells.

Additional solar cell structures are known from US 2013/0263923, from EP 1 047 136 A2 (which corresponds to U.S. Pat. No. 10,439,091), and from US 2009/0188554.

SUMMARY OF THE INVENTION

It is therefore an object of the present invention to provide a device that advances the state of the art.

According to an exemplary embodiment of the invention, a stacked multi-junction solar cell is provided, comprising a stack of at least three or four or more subcells, wherein each subcell has an emitter and a base, and the light passes through the top subcell to the other subcells.

The top subcell at least includes or is made of a III-V semiconductor material, wherein the emitter of the top subcell includes a superlattice or is made of a superlattice structure.

A tunnel diode can be formed between two directly sequential subcells. Also, the relevant subcells can be formed as n/p subcells, which is to say the n emitter is arranged above the p base layer in each case.

In other words, the light first passes through the emitter layer before it passes through the base layer. It is a matter of course that the tunnel diode is made of a highly doped, thin n layer and a highly doped, thin p layer, and the two layers of the tunnel diode are arranged integrally on one another.

The n emitter and the p base layer of the relevant subcells form a p-n junction.

The n emitter and the p base of the relevant subcells can be made of the same material but with different doping, or of different materials with different doping.

A superlattice is made from a periodic sequence of multiple different, very thin semiconductor layers. The different semiconductor layers have different band gap energy and, in pairs, form a series of potential wells and potential barriers. In the present case, "very thin semiconductor layers" refers to semiconductor layers with a thickness less than 10 nm.

A potential well is surrounded by potential barriers, which is to say that the superlattice structure begins with a potential barrier layer and ends with a potential barrier layer.

The potential barriers, which is to say the corresponding barrier layers, are made thin enough here that an overlap of the wave functions between adjacent potential wells is possible and a so-called superlattice is formed.

The different thin layers of a superlattice each have different electrical and optical characteristics, which the superlattice combines. The band gap energy of the material of the well layers is less than the band gap energy of the material of the barrier layers.

An advantage that has surprisingly become apparent is that it is possible by means of the formation of a superlattice in the emitter to achieve a high transverse conductivity as compared with an AlInGaP upper cell without significantly reducing the open circuit terminal voltage of the multi-junction solar cell.

Thus, it is possible with the formation of a superlattice in the emitter of the upper cell to achieve a transverse conductivity in a range of less than 700Ω/□ with only small sacrifices in the source voltage, in the range of a few mV, as compared with the previous solutions.

In other words, by formation of a superlattice in the emitter of the upper cell, the high open circuit terminal voltage can be maintained and at the same time the sheet resistance of the upper cell can be significantly reduced.

Especially surprisingly, it has become apparent that the short-circuit current of the solar cell is not adversely affected and the short-circuit current is not reduced in comparison with a conventional solar cell having an emitter made from a bulk layer, despite the barrier layers within the superlattice structure in the emitter.

It should be noted that on account of their complex manufacture, the superlattice structures have heretofore been formed solely to widen the absorption range in intrinsic zones, which is to say between the emitter and base of subcells, in order to extend the absorption range into the long-wave region or to improve the radiation hardness of subcells.

The superlattice can be made of multiple stacked layers, wherein adjacent layers differ with regard to a composition in at least one chemical element and/or with regard to the stoichiometry of the elements contained in the layers. As a result, the adjacent layers are made of materials with different band gap energy, and thus form a superlattice.

In other words, two directly successive layers can have a difference in elemental composition and/or in stoichiometry.

The emitter of the top subcell can also include, in addition to the superlattice, at least one additional layer, which is part of the emitter.

For example, the additional layer can be formed below the superlattice, which is to say between the base layer of the upper cell and the superlattice.

The additional layer can be formed above the superlattice.

An additional layer can be formed both below and above the superlattice.

The superlattice can have at least five, but at most 30, periods. Most preferably, the superlattice includes exactly 18 periods. It should be noted that each period can be formed of exactly one layer pair.

The superlattice can include multiple barrier layers and multiple well layers, for example five barrier layers and five well layers each, wherein the barrier layers and the well layers are stacked in alternation and the material of the well layers has a smaller band gap energy than the material of the barrier layers.

Each barrier layer can have a layer thickness of at most 6 nm, e.g., 1.5 nm, and each well layer can have a layer thickness of at most 8 nm, e.g., 2 nm.

The superlattice can have a total thickness less than 500 nm or between 20 nm and 100 nm.

The superlattice can include between 3 and 100 alternating layer pairs of well layers and barrier layers.

The limitation of the layer thicknesses ensures that a superlattice with quantum wells and thin barriers is formed. The quantization that arises within the quantum wells in this process increases the energy above which photons are absorbed and thereby ensures a high open circuit terminal voltage of the solar cell. Vertical current transport is enhanced by the thin barriers so that charge carriers that are generated by absorption in the emitter can still be separated and thus can contribute to the short-circuit current of the solar cell.

The effective band gap of the superlattice structure can be tuned by varying the thickness of the well layers, the thickness of the barrier layers, and the dopant concentrations.

Each barrier layer can have a first dopant concentration and each well layer can have a second dopant concentration, wherein the first dopant concentration is equal to or greater than or less than the second dopant concentration. Preferably, the first dopant concentration is greater than or less than the second dopant concentration by a factor of two.

The emitter of the top subcell can include Al and/or the base of the top subcell is made of AlInGaP or includes AlInGaP.

The superlattice can be made as an n-InAlP/n-InGaP superlattice or as an n-InGaP/n-InAlP superlattice. It is a matter of course that in this case the well layer is made of n-InGaP and the barrier layer is made of n-InAlP. Preferably, the base of the top subcell includes or is made of p-AlInGaP.

A superlattice layer made of alternating InGaP and InAlP layers can have a significantly higher conductivity than an AlInGaP bulk layer of equal thickness due to the better transverse conduction in the InGaP wells.

In comparison with an exclusively AlInGaP cell, slight voltage losses do still arise. But the voltage losses are smaller in comparison with the losses of an exclusively InGaP cell, and the efficiency of the solar cell with a superlattice structure in the emitter is increased as a result, since the improvements due to the reduced sheet resistance predominate substantially.

The superlattice can be made as an n-$In_xGa_{1-x}P$/n-$In_yGa_{1-y}P$ superlattice. It is a matter of course here that the In content in the well layers (x) is greater than the In content in the barrier layers (y). Due to the different In content in the alternating layers, the associated difference in band gap energy of the alternating layers likewise results in the formation of a superlattice.

At least two subcells or all subcells of the multi-junction solar cell can be formed monolithically on one another. Also, the multi-junction solar cell can include a metamorphic buffer and/or a semiconductor bond.

For example, the metamorphic buffer may be formed between the bottom subcell and the top subcell. In one improvement, the bottom subcell is made of Ge.

The multi-junction solar cell can include at least four subcells or exactly four subcells or exactly five subcells or exactly six subcells, wherein the top subcell has a band gap between 1.75 eV and 2.1 eV, and the second subcell from the top has a band gap between 1.55 eV and 1.75 eV. In the second subcell from the top, the emitter and the base each include InGaP.

The stacked multi-junction solar cell can include at least one Bragg mirror layer, also referred to as a Bragg reflector or a dielectric mirror.

The top subcell can have one or more contact fingers on the top surface.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
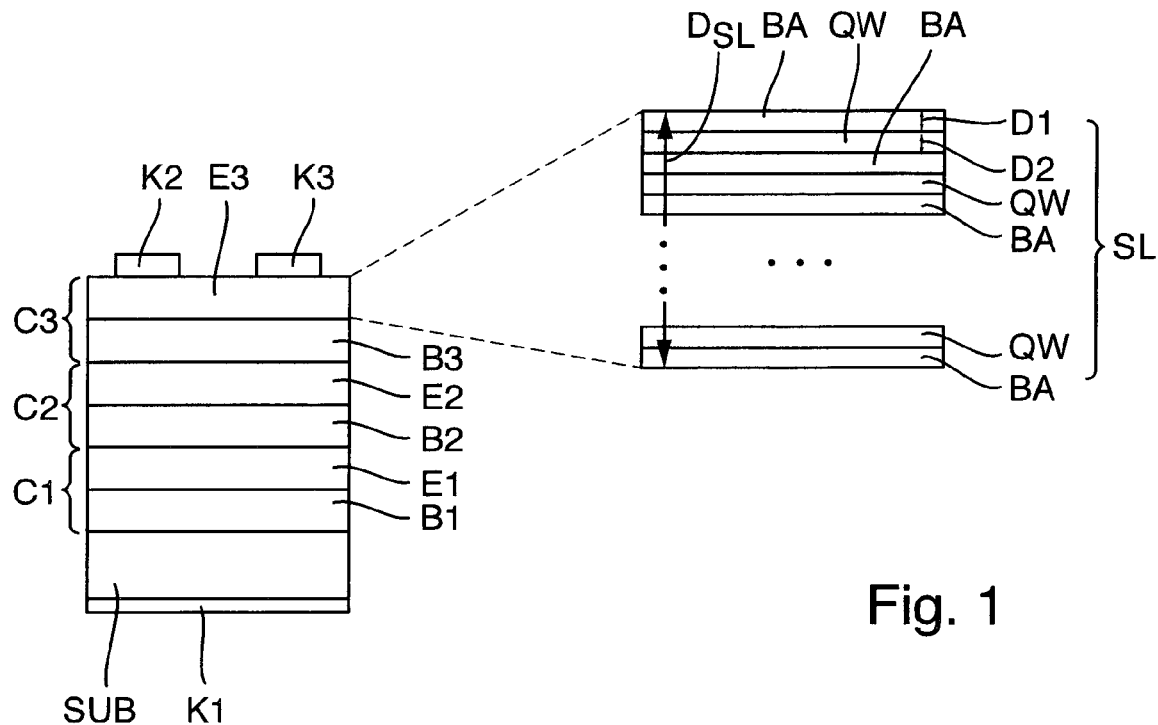
FIG. 1 is a view of a stacked multi-junction solar cell.

The illustration in FIG. 1 shows a view of an exemplary embodiment of a stacked multi-junction solar cell MJ, comprising a stack ST composed of a substrate layer SUB, a bottom subcell C1, a middle subcell C2, and a top subcell C3. A full-area contact layer K1 is formed on an underside of the stack ST. Contact fingers K2, K3 are arranged on a top surface of the stack.

Each subcell C1, C2, and C3 has one base B1, B2, B3 and one emitter E1, E2, E3 each, wherein emitter E3 and base B3 of the top subcell C3 are each made of a III-V semiconductor material.

The emitter E3 of the top subcell C3 includes a superlattice SL. The superlattice includes multiple thin well layers QW with the thickness D2 and multiple thin barrier layers BA with the thickness D1, wherein the well layers QW and the barrier layers BA are stacked on one another in alternation. The total thickness of the superlattice $D_{SL}$ results from the thickness of the alternating layers and the number of periods.

Figure 2:
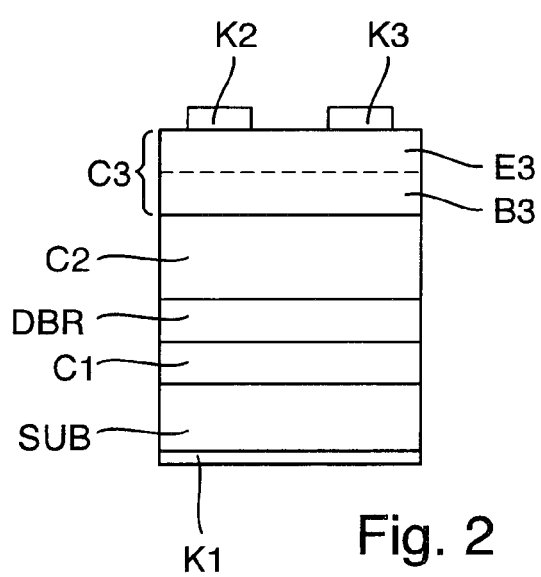
FIG. 2 is a view of a stacked multi-junction solar cell.

In the illustration in FIG. 2, another embodiment of a multi-junction solar cell MJ according to the invention is shown. Only the differences from the illustration in FIG. 1 are explained below.

The triple-junction solar cell MJ includes a Bragg mirror layer DBR arranged between the bottom subcell C1 and the middle subcell C2. A preferred material combination for the subcells is as follows: The bottom subcell C1 is formed as a GE cell, the middle subcell C2 as an (Al)InGaAs cell, and the top subcell C3 has a p-InAlGaP base B3 and an n-InAlP/n-InGaP superlattice as emitter E3.

In an embodiment that is not shown, a metamorphic buffer is formed between the GE cell and the immediately subsequent subcell. In this case, the metamorphic buffer is arranged instead of the Bragg mirror layer DBR, or is arranged between the Bragg mirror layer and the GE cell.

In another material combination, the bottom subcell C1 is formed as a GE cell, the middle subcell C2 is formed as an InGaAs cell. The top subcell C3 has a p-InGaP base B3 and an n-In$_x$Ga$_{1-x}$P/n-In$_y$Ga$_{1-y}$P superlattice as emitter E3.

In this design, the In content of the well layers x is greater than the In content of the barrier layers y, so that the band gap energy of the material of the well layers is less than the band gap energy of the material of the barrier layers.

Figure 3:
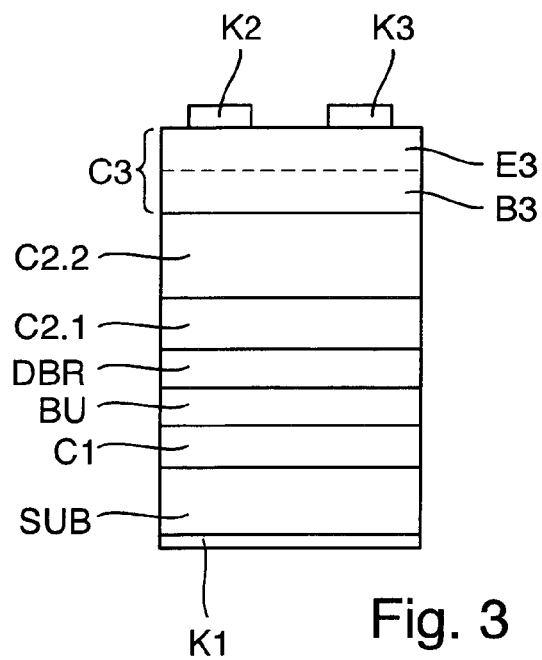
FIG. 3 is a view of a stacked multi-junction solar cell.

In the illustration in FIG. 3, another embodiment of a multi-junction solar cell MJ according to the invention is shown. Only the differences from the illustration in FIG. 1 are explained below.

The multi-junction solar cell MJ is formed as a quadruple junction solar cell, having the substrate SUB, the bottom subcell made of, e.g., Ge, a buffer layer BU, a Bragg mirror layer DBR, a first middle subcell C2.1 made of, e.g., InGaAs, a second middle subcell C2.2 made of, e.g., AlInGaAs, and the top subcell C3. The top subcell includes a base layer B3 made of, e.g., p-InAlGaP, and a superlattice, for example an n-InAlP/n-InGaP superlattice, as emitter layer E3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked multi-junction solar cell comprising:
a stack formed of a bottom subcell, at least one middle subcell, and a top subcell,
wherein each subcell has an emitter and a base,
wherein at least the top subcell is formed of a Ill-V semiconductor material or includes a III-V semiconductor material,
wherein the light passes through the top subcell to the other subcells,
wherein the emitter of the top subcell includes a superlattice or is formed substantially of a superlattice structure,
wherein the superlattice or the superlattice structure is only formed in the emitter of the top subcell,
wherein the base of the top subcell comprises p-AlInGaP,
wherein the superlattice comprises an n-InAlP/n-InGaP superlattice with n-InAlP as a barrier layer (BA) and n-InGaP as a well layer,
wherein five subcells are provided, and the top subcell has a band gap between 1.75 eV and 2.1 eV,
wherein the bottom subcell is comprises Ge, and a metamorphic buffer is formed between the bottom subcell and the top subcell, and
wherein each barrier layer has a thickness of approximately 1.5 nm.

2. The stacked multi-junction solar cell according to claim 1, wherein the superlattice is made of multiple stacked layers, wherein adjacent layers differ with regard to a composition in at least one chemical element and/or with regard to the stoichiometry.

3. The stacked multi-junction solar cell according to claim 1, wherein the emitter of the top subcell includes an additional layer in addition to the superlattice, and wherein the additional layer is part of the emitter.

4. The stacked multi-junction solar cell according to claim 1, wherein the superlattice includes multiple barrier layers (BA) and multiple well layers (QW), and wherein the barrier layers (BA) and the well layers (QW) are stacked in alternation.

5. The stacked multi-junction solar cell according to claim 4, wherein each barrier layer (BA) has a layer thickness of at most 6 nm and each well layer (QW) has a layer thickness of at most 8 nm.

6. The stacked multi-junction solar cell according to claim 4, wherein each barrier layer (BA) has a first dopant concentration, each well layer (QW) has a second dopant concentration, and the first dopant concentration is greater than or less than the second dopant concentration.

7. The stacked multi-junction solar cell according to claim 1, wherein the superlattice has a total thickness less than 500 nm.

8. The stacked multi-junction solar cell according to claim 1, wherein the superlattice includes between 3 and 100 alternating layer pairs of well layers (QW) and barrier layers (BA).

9. The stacked multi-junction solar cell according to claim 1, wherein the superlattice has a sheet resistance of less than 1200Ω/□.

10. The stacked multi-junction solar cell according to claim 1, wherein the emitter of the top subcell includes Al.

11. The stacked multi-junction solar cell according to claim 4, wherein each barrier layer (BA) has a first dopant concentration, each well layer (QW) has a second dopant concentration, and the first dopant concentration is equal to the second dopant concentration.

12. The stacked multi-junction solar cell according to claim 1, wherein the superlattice has a total thickness between 20 nm and 100 nm.

13. The stacked multi-junction solar cell according to claim 1, wherein the superlattice has a sheet resistance of less than 700Ω/□.

14. The stacked multi-junction solar cell (MJ) according to claim 1, further comprising:
   a full-area contact layer on an underside of the stack,
   wherein each emitter is an n type and each base is a p type, and
   wherein one or more contact fingers are on and in contact with the emitter of the top subcell.

15. The stacked multi-junction solar cell according to claim 4, wherein a thickness of the barrier layer is less than a thickness of the well layer.

* * * * *